United States Patent
Ogawa et al.

(10) Patent No.: US 9,556,062 B2
(45) Date of Patent: Jan. 31, 2017

(54) $Li_2O$—$Al_2O_3$—$SiO_2$ BASED CRYSTALLIZED GLASS AND METHOD FOR PRODUCING SAME

(71) Applicant: NIPPON ELECTRIC GLASS CO., LTD., Otsu-shi, Shiga (JP)

(72) Inventors: Shuhei Ogawa, Shiga (JP); Shingo Nakane, Shiga (JP)

(73) Assignee: NIPPON ELECTRIC GLASS CO., LTD., Otsu-shi, Shiga (JP)

( * ) Notice: Subject to any disclaimer, the term of this patent is extended or adjusted under 35 U.S.C. 154(b) by 0 days.

(21) Appl. No.: 14/402,150

(22) PCT Filed: May 15, 2013

(86) PCT No.: PCT/JP2013/063531
§ 371 (c)(1),
(2) Date: Nov. 19, 2014

(87) PCT Pub. No.: WO2013/179894
PCT Pub. Date: Dec. 5, 2013

(65) Prior Publication Data
US 2015/0266773 A1    Sep. 24, 2015

(30) Foreign Application Priority Data

May 31, 2012 (JP) ................. 2012-124081

(51) Int. Cl.
C03C 10/12 (2006.01)
C03B 32/02 (2006.01)
C03C 10/00 (2006.01)
C03C 3/097 (2006.01)
C30B 1/02 (2006.01)
C30B 29/18 (2006.01)
C30B 29/34 (2006.01)

(52) U.S. Cl.
CPC .......... C03C 10/0027 (2013.01); C03B 32/02 (2013.01); C03C 3/097 (2013.01); C30B 1/023 (2013.01); C30B 29/18 (2013.01); C30B 29/34 (2013.01); C03C 2204/00 (2013.01)

(58) Field of Classification Search
CPC .................................. C03C 10/0027
See application file for complete search history.

(56) References Cited

U.S. PATENT DOCUMENTS

| | | | | |
|---|---|---|---|---|
| 5,492,869 A | * | 2/1996 | Beall | C03C 10/0027 501/68 |
| 9,126,859 B2 | * | 9/2015 | Nakane | C03C 3/097 |
| 2012/0035041 A1 | * | 2/2012 | Comte | C03B 5/193 501/32 |
| 2013/0130887 A1 | * | 5/2013 | Nakane | C03C 3/097 501/32 |
| 2013/0201678 A1 | * | 8/2013 | Siebers | C03B 32/02 362/231 |
| 2013/0288876 A1 | * | 10/2013 | Fujisawa | C03C 10/0027 501/32 |

FOREIGN PATENT DOCUMENTS

| | | | |
|---|---|---|---|
| CN | 101734859 | * | 6/2010 |
| CN | 103068763 A | | 4/2013 |
| DE | 10 2010 032 112 A1 | | 1/2012 |
| EP | 2 660 214 A1 | | 11/2013 |
| JP | 2004-523446 | * | 8/2004 |
| JP | 2012-056829 A | | 3/2012 |

OTHER PUBLICATIONS

Leipold "Impurity Distribution in MgO" Journal of American Ceramic Society(1966)pp. 498-502.*
Notification of Reasons of Refusal issued Feb. 9, 2016 in Japanese Patent Application No. 2012-124081 (3 pages) with English Transaltion (3 pages).
Extended European Search Report issued Feb. 1, 2016 in European Patent Application No. 13796338.5.
Notification of the First Office Action issued Mar. 3, 2016 in Chinese Patent Application No. 201380027702.2 (11 pages) with an English Translation (13 pages).
Notification of Reasons for Refusal issued Aug. 23, 2016 in Japanese Patent Application No. 2012-124081 (4 pages) with an English Translation (4 pages).

* cited by examiner

Primary Examiner — Karl Group
(74) Attorney, Agent, or Firm — Drinker Biddle & Reath LLP

(57) ABSTRACT

In a $Li_2O$—$Al_2O_3$—$SiO_2$ based crystallized glass using $SnO_2$ as a substitute fining agent for $As_2O_3$ or $Sb_2O_3$, a crystallized glass having less yellow coloration is provided at low costs. The glass is a $Li_2O$—$Al_2O_3$—$SiO_2$ based crystallized glass comprising from 0.01 to 0.9% of $SnO_2$ in terms of % by mass and having a content of each of $As_2O_3$ and $Sb_2O_3$ of 1,000 ppm or less as a glass composition, which has a $V_2O_5$ content of from 0.08 to 15 ppm in the glass composition.

7 Claims, No Drawings

$Li_2O$—$Al_2O_3$—$SiO_2$ BASED CRYSTALLIZED GLASS AND METHOD FOR PRODUCING SAME

TECHNICAL FIELD

The present invention relates to a $Li_2O$—$Al_2O_3$—$SiO_2$ based crystallized glass and a method for producing the same. More specifically, it relates to a $Li_2O$—$Al_2O_3$—$SiO_2$ based crystallized glass suitable for heat-resistant applications such as front windows of oil stoves, wood stoves, and the like and top plates for cookers, and a method for producing the same.

BACKGROUND ART

A $Li_2O$—$Al_2O_3$—$SiO_2$ based crystallized glass in which a $Li_2O$—$Al_2O_3$—$SiO_2$ based crystal such as a β-quartz solid solution ($Li_2O.Al_2O_3.nSiO_2$ [4>n≥2]) or a β-spodumene solid solution ($Li_2O.Al_2O_3.nSiO_2$ [n≥4]) is precipitated has a low coefficient of thermal expansion and high mechanical strength and hence has excellent thermal characteristics. In addition, it is possible to regulate the kind of a precipitated crystal by appropriately adjusting heat treatment conditions in a crystallization step, so that a transparent crystallized glass (a β-quartz solid solution precipitates as a main crystal) and an opaque crystallized glass (a β-spodumene solid solution precipitates as a main crystal) can be easily produced. Making use of such characteristics, the $Li_2O$—$Al_2O_3$—$SiO_2$ based crystallized glass has been widely used as materials such as front windows of oil stoves, wood stoves, and the like, substrates for high-technology products such as color filter substrates and image sensor substrates, setters for firing electronic components, trays for microwave ovens, top plates of electromagnetic cookers, and window glasses for fire-retarding doors.

Moreover, there has been known a $Li_2O$—$Al_2O_3$—$SiO_2$ based crystallized glass in which a coloration component such as $V_2O_5$ is added to a $Li_2O$—$Al_2O_3$—$SiO_2$ based crystallized glass to color it dark-brown. The colored crystallized glass hardly transmits a visible light but has a high infrared transmittance, so that the glass has been used as top plates of cookers utilizing infrared rays.

Incidentally, in the case of producing a $Li_2O$—$Al_2O_3$—$SiO_2$ based crystallized glass, it is necessary to perform melting at a high temperature exceeding 1,400° C. Therefore, as a fining agent to be added to a glass batch, $As_2O_3$ or $Sb_2O_3$ capable of generating a lot of a fining gas at the time of melting at the high temperature has been used. However, since $As_2O_3$ and $Sb_2O_3$ exhibit strong toxicity, attention should be paid so as not to contaminate the environment at the production process of the glass, at the time of treating a waste glass, or at a similar time.

Accordingly, $SnO_2$ has been proposed as a substitute fining agent for $As_2O_3$ or $Sb_2O_3$ (e.g., see Patent Reference 1).

CITED REFERENCES

Patent References

Patent Reference 1: JP-A-11-228181
Patent Reference 2: U.S. Pat. No. 4,093,468

SUMMARY OF THE INVENTION

Problems to be Solved by the Invention

However, in the case of using $SnO_2$ as a fining agent, yellowish coloration occurs in the $Li_2O$—$Al_2O_3$—$SiO_2$ based crystallized glass. This coloration is especially problematic in the case of obtaining a transparent crystallized glass.

As a method for suppressing coloration of a transparent crystallized glass, there is a method of adding a colorant having a complimentary color relation to erase color. Particularly, for the $Li_2O$—$Al_2O_3$—$SiO_2$ based crystallized glass, it is hitherto known that $Nd_2O_3$ is effective for erasing color (e.g., see Patent Reference 2). Therefore, even in the case where the yellowish color becomes strong by the addition of $SnO_2$, it is possible to erase color by adding $Nd_2O_3$. However, since the color erasing with $Nd_2O_3$ is, so to speak, a technology of making the yellow coloration achromatic by overlaying blue coloration with $Nd_2O_3$, there are problems that transmittance in a visual region decreases as a result, the appearance looks blackish, and a transparent feeling is easily impaired. In addition, since $Nd_2O_3$ is a rare metal and a batch cost becomes very high, it is impossible to provide an inexpensive $Li_2O$—$Al_2O_3$—$SiO_2$ based crystallized glass.

An object of the present invention is to provide a $Li_2O$—$Al_2O_3$—$SiO_2$ based crystallized glass having less yellow coloration in the crystallized glass using $SnO_2$ as a substitute fining agent for $As_2O_3$ or $Sb_2O_3$.

Means for Solving the Problems

The present inventors made extensive and intensive investigations. As a result, it has been found that (1) when $V_2O_5$ and $SnO_2$ coexist, coloration of $V_2O_5$ is enhanced by $SnO_2$ and a glass is colored, (2) the coloration caused by $V_2O_5$ occurs in a minute amount of $V_2O_5$ to which consideration is usually not necessary, and (3) a considerable amount of $V_2O_5$ is contained in usual glass raw materials as an impurity, and thus they have proposed the present invention. Incidentally, even when $As_2O_3$ or $Sb_2O_3$ is used as a fining agent, the coloration of $V_2O_5$ does not become strong. Moreover, in a dark-brown crystallized glass, $V_2O_5$ is used as a coloring agent in the first place, so that the problem itself is not present. Namely, this problem is first revealed by the use of $SnO_2$ as a fining agent for a $Li_2O$—$Al_2O_3$—$SiO_2$ based crystallized glass intentionally containing no $V_2O_5$, especially a $Li_2O$—$Al_2O_3$—$SiO_2$ based transparent crystallized glass.

The $Li_2O$—$Al_2O_3$—$SiO_2$ based crystallized glass of the present invention devised in consideration of the above circumstances is a $Li_2O$—$Al_2O_3$—$SiO_2$ based crystallized glass comprising from 0.01 to 0.9% of $SnO_2$ in terms of % by mass and having a content of each of $As_2O_3$ and $Sb_2O_3$ of 1,000 ppm or less as a glass composition, which has a $V_2O_5$ content of from 0.08 to 15 ppm in the glass composition. In the present invention, the "$Li_2O$—$Al_2O_3$—$SiO_2$ based crystallized glass" means a crystallized glass in which a crystal comprising $Li_2O$, $Al_2O_3$ and $SiO_2$ as essential components is precipitated as a main crystal. The crystal comprising $Li_2O$, $Al_2O_3$ and $SiO_2$ as essential components means a $Li_2O$—$Al_2O_3$—$SiO_2$ based crystal such as a β-quartz solid solution ($Li_2O.Al_2O_3.nSiO_2$ [4>n≥2]) or β-spodumene solid solution ($Li_2O.Al_2O_3.nSiO_2$ [n≥4]), for example. Moreover, the "$V_2O_5$ content in the glass composition" is an amount of total V (vanadium) components contained in the glass composition in terms of $V_2O_5$. The V components may be intentionally added or may be unavoidably mixed in.

In the present invention, it is preferable to comprise from 55 to 75% of $SiO_2$, from 10 to 35% of $Al_2O_3$, from 1 to 10% of $Li_2O$, from 0.2 to 5% of MgO, from 0 to 5% of ZnO, from 0 to 10% of BaO, from 0 to 4% of $TiO_2$, from 0 to 5% of $ZrO_2$, from 0 to 4% of $P_2O_5$, and from 0.01 to 0.9% of $SnO_2$, in terms of % by mass, as a glass composition. In the present invention, there is not excluded the case where a component other than the above components is contained.

In the present invention, it is preferable to comprise from 17 to 27% of $Al_2O_3$ and from 0.2 to 4% of MgO, in terms of % by mass, as a glass composition.

As a cause of mixing of the $V_2O_5$ impurities, there are mentioned mixing from raw materials and mixing at the glass production process. With regard to the raw materials, it has been found that much one is mixed in from raw materials of $Al_2O_3$ and MgO. Accordingly, when the above constitution is adopted, the contents of $Al_2O_3$ and MgO can be limited, so that the amount of mixing of $V_2O_5$ can be effectively reduced.

In the present invention, it is preferable that $Li_2O$ 0.741MgO+0.367ZnO is from 3.7 to 5.0%, in terms of % by mass, as a glass composition. Incidentally, the "$Li_2O$+ 0.741MgO+0.367ZnO" means a value obtained by summing the content of $Li_2O$, the content of 0.741×MgO, and the content of 0.367×ZnO.

In the $Li_2O$—$Al_2O_3$—$SiO_2$ based crystallized glass, $SnO_2$ has a function of strengthening coloration caused by not only $V_2O_5$ but also $Fe_2O_3$, $TiO_2$, and the like. For suppressing the coloration, it is suitable to increase the $Al_2O_3$ amount contained in a remaining glass phase after crystallization. $Li_2O$, MgO and ZnO tends to precipitate in a crystal phase along with $Al_2O_3$. Thus, by decreasing the amounts of these components, it becomes possible to reduce the $Al_2O_3$ amount to be distributed into the crystal phase to distribute more amount of $Al_2O_3$ into a glass phase. Accordingly, when the above constitution is adopted, the amounts of $Li_2O$, MgO and ZnO can be restricted to the necessary minimum and the $Al_2O_3$ amount in the remaining glass phase can be increased.

In the present invention, the $Fe_2O_3$ content in the glass composition is preferably 250 ppm or less. The "$Fe_2O_3$ content in the glass composition" is an amount of total Fe (iron) components contained in the glass composition in terms of $Fe_2O_3$. The Fe components may be intentionally added or may be unavoidably mixed in.

As already mentioned, $Fe_2O_3$ becomes a cause of coloration similarly to $V_2O_5$. Accordingly, when the above constitution is adopted, it becomes easy to suppress the coloration caused by $Fe_2O_3$.

In the present invention, it is preferable that transmittance of a light having a wavelength of 525 nm is 89% or more at a thickness of 1.1 mm. Here, the term "at a thickness of 1.1 mm" means a value obtained by converting a measured value of transmittance in terms of a thickness of 1.1 mm.

In the present invention, it is preferable that the b* value of L*a*b* colorimetric system of CIE standard is from 0 to 4.5 at a thickness of 3 mm. Here, the term "at a thickness of 3 mm" means a measured value of the b*value at a thickness of a measurement sample of 3 mm.

In the present invention, it is preferable that a β-quartz solid solution is precipitated as a main crystal.

When the β-quartz solid solution precipitates as a main crystal, the crystallized glass is liable to be transparent to a visible light. In the case of a transparent crystallized glass, since the coloration by $V_2O_5$ remarkably influences the appearance, the effect exerted by applying the present invention can be more precisely enjoyed in the case of adopting the above constitution.

Moreover, the method for producing a $Li_2O$—$Al_2O_3$—$SiO_2$ based crystallized glass of the present invention is a method for producing a $Li_2O$—$Al_2O_3$—$SiO_2$ based crystallized glass which comprises preparing a raw material batch so as to form a glass comprising from 0.01 to 0.9% of $SnO_2$ in terms of % by mass and having a content of each of $As_2O_3$ and $Sb_2O_3$ of 1,000 ppm or less, melting and forming the batch to produce a $Li_2O$—$Al_2O_3$—$SiO_2$ based crystallizable glass, and subsequently subjecting the glass to a heat treatment to achieve crystallization, wherein selection of raw materials and management of steps are performed so that a $V_2O_5$ content in the glass becomes from 0.08 to 15 ppm. Here, the "management of steps" means that the mixing of $V_2O_5$ from the production process is appropriately managed, for example, contamination of a compounding equipment and a conveying equipment of the raw material batch is prevented.

In the present invention, it is preferable to prepare the batch so as to form a glass comprising from 55 to 75% of $SiO_2$, from 10 to 35% of $Al_2O_3$, from 1 to 10% of $Li_2O$, from 0.2 to 5% of MgO, from 0 to 5% of ZnO, from 0 to 10% of BaO, from 0 to 4% of $TiO_2$, from 0 to 5% of $ZrO_2$, from 0 to 4% of $P_2O_5$, and from 0.01 to 0.9% of $SnO_2$, in terms of % by mass, as a glass composition. Incidentally, in the present invention, there is not excluded the case where a component other than the above components is contained.

In the present invention, it is preferable that a raw material having a $V_2O_5$ content of 50 ppm or less is used as a raw material of $Al_2O_3$. Moreover, it is preferable that a raw material having a $V_2O_5$ content of 400 ppm or less is used as a raw material of MgO.

As already mentioned, $V_2O_5$ is largely mixed in from raw materials of $Al_2O_3$ and MgO. Accordingly, when the above constitution is adopted, the $V_2O_5$ amount to be mixed in from $Al_2O_3$ and MgO can be effectively reduced.

In the present invention, it is preferable that melting is performed at a temperature of less than 1,750° C.

As the temperature is elevated, the coloring action of $V_2O_5$ by $SnO_2$ is strengthened. Accordingly, when the above constitution is adopted, the coloration caused by $V_2O_5$ can be effectively suppressed.

In the present invention, it is preferable that a β-quartz solid solution is precipitated as a main crystal by a heat treatment.

When the β-quartz solid solution is precipitated as a main crystal, since the crystallized glass is liable to be transparent to a visible light, the effect exerted by applying the present invention can be more precisely enjoyed in the case of adopting the above constitution.

Effect of the Invention

In the $Li_2O$—$Al_2O_3$—$SiO_2$ based crystallized glass of the present invention, since the $V_2O_5$ content is strictly restricted, the coloration caused by coloring of $V_2O_5$ is suppressed although $SnO_2$ is used as a fining agent as a substitute fining agent for $As_2O_3$ or $Sb_2O_3$.

Moreover, according to the method of the present invention, even when an expensive decoloring agent such as $Nd_2O_3$ is not used, a $Li_2O$—$Al_2O_3$—$SiO_2$ based crystallized glass having no coloration can be produced.

EMBODIMENTS FOR CARRYING OUT THE INVENTION

The following will describe the $Li_2O$—$Al_2O_3$—$SiO_2$ based crystallized glass of the present invention. Incidentally, the term "%" in the following explanation means "% by mass" unless otherwise indicated.

In the $Li_2O$—$Al_2O_3$—$SiO_2$ based crystallized glass of the present invention, the $V_2O_5$ content is strictly restricted and is reduced to a level where the coloring of $V_2O_5$ does not cause an influence. The reason why the coloring of $V_2O_5$ becomes not problematic in the case of using $As_2O_3$ or $Sb_2O_3$ and becomes problematic in the case of using $SnO_2$ is not sufficiently elucidated but the present inventors have surmised as follows.

$V_2O_5$ and $SnO_2$ are not incorporated into a crystal and remain in a glass matrix phase. In other words, these components are concentrated in the glass matrix phase. Furthermore, when an oxidation-reduction reaction with $V_2O_5$ from standard electrode potential is compared, in $SnO_2$, the oxidation reaction from $Sn^{2+}$ to $Sn^{4+}$ is energetically advantageous and $V_2O_5$ is liable to be reduced, thereby increasing $V^{4+}$. In combination of these conditions, even when the content of $V_2O_5$ is minute, it is considered that the coloration of the glass becomes a non-negligible level. On the other hand, in $As_2O_3$ or $Sb_2O_3$, when the oxidation-reduction reaction with $V_2O_5$ from standard electrode potential is compared as described above, the reduction reaction of $V_2O_5$ becomes energetically disadvantageous as compared with the case of $SnO_2$ and thus $V_2O_5$ is difficultly reduced, so that $V^{4+}$ is not increased. Accordingly, in the conventional crystallized glass using $As_2O_3$ or $Sb_2O_3$ as a fining agent, it is considered that the coloration by $V_2O_5$ does not become problematic.

The following will describe a mixing source of $V_2O_5$. As the mixing of $V_2O_5$, mixing from the raw materials and mixing at the glass production process are considered.

First, the mixing of $V_2O_5$ from the glass raw materials will be described. When impurities contained in glass raw materials are analyzed, it has been confirmed that there are raw materials containing much $V_2O_5$ as an impurity among those widely used as raw materials of $Al_2O_3$ and MgO. Moreover, there exist those containing a large amount of $V_2O_5$ also among the other raw materials, for example, those to be used as raw materials of $SiO_2$, raw materials of $ZrO_2$, and the like. Therefore, it is desirable to select raw materials each containing less amount of the $V_2O_5$ impurity, especially raw materials of $Al_2O_3$ and MgO each having a small content of $V_2O_5$. Moreover, it is desirable to design a composition having small contents of $Al_2O_3$ and MgO so that the use amounts of the raw materials of $Al_2O_3$ and MgO can be reduced as far as possible.

The following will describe the mixing of $V_2O_5$ from the glass production process. In the case where a glass using $V_2O_5$ as a raw material is produced in the same factory or a glass containing $V_2O_5$ is stored in the factory, a raw material of $V_2O_5$ or a cullet of a glass containing $V_2O_5$ is easily mixed in at a conveying line of the raw material or the cullet. In such a case, it is desirable to reduce $V_2O_5$ to be mixed in from the process as far as possible by no use of the line in which the raw material of $V_2O_5$ is handled at the time of conveying raw materials or batch blending or by keeping the conveying line and a storage place of the $V_2O_5$-containing glass cullet away from the production line of the $Li_2O$—$Al_2O_3$—$SiO_2$ based crystallized glass as far as possible.

In the $Li_2O$—$Al_2O_3$—$SiO_2$ based crystallized glass of the present invention, the $V_2O_5$ content is limited to from 0.08 to 15 ppm. As already mentioned, the $V_2O_5$ amount of 15 ppm or less can be achieved by devising raw materials, a glass composition, steps, and the like. When $V_2O_5$ is controlled to 15 ppm or less, a less colored $Li_2O$—$Al_2O_3$—$SiO_2$ based crystallized glass, especially a transparent $Li_2O$—$Al_2O_3$—$SiO_2$ based crystallized glass can be obtained. The content of $V_2O_5$ is preferably 10 ppm or less, more preferably 5 ppm or less, and further preferably 3 ppm or less.

Incidentally, even when complete prevention of the mixing of $V_2O_5$ from the process is succeeded, it is difficult to prevent the mixing of $V_2O_5$ from raw materials completely. When raw materials resulting in the $V_2O_5$ amount of 0.08 ppm or less are used, costs for the raw material drastically increase, so that it becomes difficult to obtain an inexpensive $Li_2O$—$Al_2O_3$—$SiO_2$ based crystallized glass. Accordingly, when the $V_2O_5$ content is defined to 0.08 ppm or more, preferably 0.1 ppm or more, further preferably 0.3 ppm or more, it becomes possible to provide a lower-cost and inexpensive $Li_2O$—$Al_2O_3$—$SiO_2$ based crystallized glass.

$As_2O_3$ or $Sb_2O_3$ are environmental burden substances and are not substantially contained in the present invention. Specifically, the content of each of $As_2O_3$ and $Sb_2O_3$ is 1,000 ppm or less, preferably 500 ppm or less, and further preferably 200 ppm or less.

$SnO_2$ is a component to be a substitute fining agent for $As_2O_3$ or $Sb_2O_3$. The content of $SnO_2$ is 0.01% or more, preferably 0.08% or more, and especially preferably 0.1% or more. An upper limit of the content of $SnO_2$ is 0.9%, more preferably 0.5% or less, more preferably 0.4% or less, and especially preferably 0.3% or less. When the content of $SnO_2$ is less than 0.01%, the effect as a fining agent is difficultly obtained. On the other hand, when the content of $SiO_2$ exceeds 0.9%, the coloration of $V_2O_5$ as a minute component becomes strong or the coloration of $TiO_2$ and $Fe_2O_3$ becomes too strong, so that the crystallized glass is liable to be colored yellowish and is prone to be easily devitrified.

Also, the $Li_2O$—$Al_2O_3$—$SiO_2$ based crystallized glass of the present invention preferably comprises a composition of from 55 to 75% of $SiO_2$, from 10 to 35% of $Al_2O_3$, from 1 to 10% of $Li_2O$, from 0.2 to 5% of MgO, from 0 to 5% of ZnO, from 0 to 10% of BaO, from 0 to 4% of $TiO_2$, from 0 to 5% of $ZrO_2$, from 0 to 4% of $P_2O_5$, and from 0.01 to 0.9% of $SnO_2$, in terms of % by mass. Particularly, the glass desirably comprises a composition of from 60 to 75% of $SiO_2$, from 17 to 27% of $Al_2O_3$, from 3 to 6% of $Li_2O$, from 0.2 to 4% of MgO, from 0 to 4% of ZnO, $3.7 \leq Li_2O + 0.741MgO + 0.367ZnO \leq 5.0$, from 0.3 to 10% of BaO, from 0 to 2% of $TiO_2$, from 1 to 4% of $ZrO_2$, from 1 to 6% of $TiO_2 + ZrO_2$, from 0 to 3% of $P_2O_5$, and from 0.01 to 0.3% of $SnO_2$, in terms of % by mass. The following will describe reasons why each component is defined as described above.

$SiO_2$ is a component that forms a skeleton of the glass and also constitutes a $Li_2O$—$Al_2O_3$—$SiO_2$ based crystal. The content of $SiO_2$ is preferably from 55 to 75%, more preferably from 58 to 70%, and especially preferably from 60 to 68%. When the content of $SiO_2$ is too small, the coefficient of thermal expansion tends to become high and it becomes difficult to obtain a crystallized glass excellent in thermal impact resistance. Also, chemical durability tends to decrease. On the other hand, when the content of $SiO_2$ is too large, melting ability of the glass becomes worse and the viscosity of a glass melt increases, so that there is a tendency that fining becomes difficult and forming of the glass becomes difficult.

$Al_2O_3$ is a component that forms a skeleton of the glass and also constitutes a $Li_2O$—$Al_2O_3$—$SiO_2$ based crystal. Moreover, $Al_2O_3$ can reduce, by its presence in the remaining glass phase of the crystallized glass, an increase in coloration due to $SnO_2$ and thus can diminish the coloration of the $Li_2O$—$Al_2O_3$—$SiO_2$ based crystallized glass to be a base. The larger the $Al_2O_3$ content in the glass composition is, the more the $Al_2O_3$ amount in the remaining glass phase after crystallization is, so that the coloration of the base glass can be reduced. Therefore, the content of $Al_2O_3$ is preferably 10% or more, more preferably 17% or more, further preferably 20% or more, especially preferably 20.5% or more, and most preferably 21.0% or more. When the content of $Al_2O_3$ is small, there is a tendency that the effect of reducing the increase in the coloration due to $SnO_2$ becomes difficult to obtain. Also, the coefficient of thermal expansion tends to become high and it becomes difficult to obtain a crystallized glass excellent in thermal impact resistance. Also, chemical durability tends to decrease. On the other hand, raw materials of $Al_2O_3$ frequently contain much $V_2O_5$ impurity. Moreover, when the content of $Al_2O_3$ is too large, melting ability of the glass becomes worse and the viscosity of a glass melt increases, so that there is a tendency that fining becomes difficult and forming of the glass becomes difficult. Furthermore, crystals of mullite precipitate and the glass tends to devitrify. Accordingly, an upper limit of the content of $Al_2O_3$ is preferably 35% or less, more preferably 30% or less, further preferably 27% or less, and especially preferably 25% or less.

$Li_2O$ is a component that constitutes a $Li_2O$—$Al_2O_3$—$SiO_2$ based crystal, and is a component that exerts a large influence on crystallinity and also lowers the viscosity of the glass to improve glass melting ability and forming ability. The content of $Li_2O$ is preferably 1% or more, more preferably 2% or more, further preferably 2.5% or more, and especially preferably 3% or more. When the content of $Li_2O$ is too small, crystals of mullite precipitate and the glass tends to devitrify. Also, at the time of crystallization of the glass, the $Li_2O$—$Al_2O_3$—$SiO_2$ based crystal is less liable to precipitate and there is a tendency that a crystallized glass excellent in thermal impact resistance is difficult to obtain. Furthermore, melting ability of the glass becomes worse and the viscosity of a glass melt increases, so that there is a tendency that fining becomes difficult and forming of the glass becomes difficult. On the other hand, when the content of $Li_2O$ is too large, the crystallinity becomes too strong, so that the glass tends to devitrify and the glass is liable to break. Accordingly, the content of $Li_2O$ is preferably 10% or less, more preferably 6% or less, further preferably 5% or less, and especially preferably 4.5% or less, and most preferably 4% or less.

MgO is a component that exerts an influence on the coefficient of thermal expansion. For example, in the case where the glass is used in heat-resistant applications, in order to reduce a risk of breakage by thermal impact, the coefficient of thermal expansion is preferably close to 0 as far as possible. Accordingly, in the crystallized glass of the present invention, it is preferable that MgO is contained in an amount of 0.2% or more, particularly 0.5% or more. When MgO is contained in an amount of 0.2% or more, the coefficient of thermal expansion of the crystallized glass is liable to be close to 0. On the other hand, since a raw material of MgO tends to contain much $V_2O_5$ impurity, the mixing amount of $V_2O_5$ is liable to increase when the content of MgO is too large. Accordingly, the content of MgO is preferably 5% or less and more preferably 4% or less, and it is particularly preferable to limit the content to 2.9% or less.

ZnO is a component that exerts an influence on the coefficient of thermal expansion and its content is preferably from 0 to 5%, more preferably from 0 to 4%, and especially preferably from 0 to 3%. When the content of ZnO is too large, devitrification is liable to occur.

Furthermore, it is preferable to limit $Li_2O+0.741MgO+0.367ZnO$ to 5.0% or less, particularly 4.8% or less, 4.6% or less, further 4.5% or less. When the value is small, the $Al_2O_3$ amount in the remaining glass phase in the crystallized glass is liable to be large and the coloration of the crystallized glass to be a base may be easily reduced. On the other hand, when the value of the above formula is too small, a grain diameter of the $Li_2O$—$Al_2O_3$—$SiO_2$ based crystal in the crystallized glass becomes large and there is a tendency that white turbidity is liable to generate. As a result, there is a concern that a transparent feeling of the crystallized glass is impaired, so that a lower limit thereof is preferably set to 3.7% or more.

BaO is a component that enhances a fining effect and, in the case of obtaining a white opaque glass, enhances whiteness of the glass. Its content is preferably from 0 to 10% and especially preferably from 0.3 to 10%. When the content of BaO is too large, the coefficient of thermal expansion tends to become large.

$TiO_2$ and $ZrO_2$ are nucleation agents. The contents of these nucleation agents are desirably strictly controlled for the following reasons. Namely, the larger the content of $TiO_2$ is, the more the crystal nuclei form and the less liable the generation of white turbidity is. On the other hand, when the content of $TiO_2$ is large, the coloration is liable to be strong. Moreover, the larger the content of $ZrO_2$ is, the more the crystal nuclei form and the less liable the generation of white turbidity is. On the other hand, when the content of $ZrO_2$ is large, devitrification tendency becomes strong and there is a tendency that a problem tends to occur in the forming step. Accordingly, an appropriate range of these nucleation agents are investigated in consideration of the $Al_2O_3$ amount, the amount of $Li_2O+0.741MgO+0.367ZnO$, and the like. As a result, the content of $TiO_2$ is preferably from 0 to 4%, more preferably from 1 to 3.5%, and especially preferably from 1 to 2.8% and the content of $ZnO_2$ is preferably from 0 to 5% and especially preferably from 1 to 4%. A lower limit of $TiO_2+ZrO_2$ (total amount of $TiO_2$ and $ZrO_2$) is preferably 1% and especially preferably 3%. Moreover, an upper limit of $TiO_2+ZrO_2$ is preferably 9% and particularly desirably 6%.

$P_2O_5$ is a component that promotes phase separation of the glass and makes the precipitation of the $Li_2O$—$Al_2O_3$—$SiO_2$ based crystal easy. Its content is preferably from 0 to 4% and particularly desirably from 0 to 3%. When the content of $P_2O_5$ is too large, white turbidity is liable to generate and the coefficient of thermal expansion tends to increase.

When $Nd_2O_3$ and CoO that are colorants are used, the coloration can be reduced due to the effect of complementary colors. However, $Nd_2O_3$ and CoO are rare resources and cost high, so that it becomes difficult to provide a low-cost and inexpensive $Li_2O$—$Al_2O_3$—$SiO_2$ based crystallized glass when these components are used. Moreover, transmittance in a visible region is lowered and the appearance looks blackish, and a transparent feeling tends to be impaired. Therefore, the contents of $Nd_2O_3$ and CoO are preferably each less than 500 ppm, more preferably each less than 300 ppm, and further desirably each less than 100 ppm.

Also, as for $Fe_2O_3$ that mixes in as an impurity component, the content is desirably limited. Specifically, the content of $Fe_2O_3$ is preferably 250 ppm or less and especially preferably 200 ppm or less. As for $Fe_2O_3$, a smaller content is more preferable, since coloration decreases. However, for example, in order to control the content to less than 50 ppm, it is necessary to use highly pure raw materials and it becomes difficult to provide an inexpensive $Li_2O$—$Al_2O_3$—$SiO_2$ based crystallized glass. Accordingly, the content of $Fe_2O_3$ is desirably 50 ppm or more.

In addition, in the $Li_2O$—$Al_2O_3$—$SiO_2$ based crystallized glass of the present invention, color tone of a transmitted light at a thickness of 3 mm is preferably 4.5 or less, more preferably 4.0 or less, and especially preferably 3.5 or less in terms of the b* value of L*a*b* indication of CIE standard. Also, transmittance of a light having a wavelength of 525 nm is preferably 89% or more and especially preferably 89.5% or more at a thickness of 1.1 mm.

Furthermore, since the $Li_2O$—$Al_2O_3$—$SiO_2$ based crystallized glass of the present invention is used in heat-resistance applications, the coefficient of thermal expansion is preferably close to zero as far as possible. Specifically, the coefficient is preferably from $-2.5 \times 10^{-7}/°$ C. to $2.5 \times 10^{-7}/°$ C. and especially preferably from $-1.5 \times 10^{-7}/°$ C. to $1.5 \times 10^{-7}/°$ C. in a temperature range of from 30 to 380° C. When the coefficient of thermal expansion is out of the range, a risk of breakage by thermal impact is liable to increase.

The following will describe the method for producing a $Li_2O$—$Al_2O_3$—$SiO_2$ based crystallized glass of the present invention.

First, a batch is prepared so as to be a target glass composition. Since the target composition is as already described, an explanation thereof is omitted.

Here, it is necessary to select a raw material of $Al_2O_3$, a raw material of MgO, and the like each having a small $V_2O_5$ content so that the $V_2O_5$ amount contained in a glass becomes from 0.08 to 15 ppm. In addition, contamination with $V_2O_5$ from the process is excluded as far as possible by managing the steps. For example, dedicated equipments are used for compounding and conveying a raw material batch and a place of installing a line is devised so that no influence is exerted from production facilities of a $V_2O_5$ containing glass.

Then, the glass raw material batch is melted. A degree of the coloration of the crystallized glass is influenced by not only the glass composition but also melting conditions. Particularly, in the case of adding $SnO_2$, the coloration tends to become strong when the molten glass goes toward a reduction direction. The reason is considered that $Sn^{2+}$ has a large influence on the coloration as compared with $Sn^{4+}$. In order that the molten glass may not go toward the reduction direction as far as possible, it is preferable that melting temperature is lowered or melting time is shortened. For the melting time, melting efficiency (melting area/flow rate) can be adopted as its index. Thus, by limiting the melting temperature and the melting efficiency, it becomes possible to prevent the molten glass from going toward the reduction direction to obtain a crystallized glass having a reduced coloration.

Maximum temperature at the time of glass melting is preferably less than 1,750° C. and especially preferably 1,700° C. or less. When the maximum temperature at the time of glass melting is 1,750° C. or more, a component of Sn is liable to be reduced and the coloration tends to become strong. The phenomenon tends to occur more remarkably particularly when $V_2O_5$ is present as an impurity. A lower limit of the maximum temperature at the time of glass melting is not particularly limited but is preferably 1,600° C. or more and especially preferably 1,650° C. or more in order to advance a glass reaction sufficiently to obtain a homogeneous glass.

The melting efficiency of the glass is preferably from 1 to 6 $m^2/(t/day)$, and especially preferably from 1.5 to 5 $m^2/(t/day)$. When the melting efficiency of the glass is less than 1 $m^2/(t/day)$, the melting time is shortened and as a result fining time is also shortened, so that there is a tendency that a glass excellent in bubble quality is difficult to obtain. On the other hand, when the melting efficiency of the glass exceeds 6 $m^2/(t/day)$, a component of Sn is liable to be reduced and the coloration tends to become strong.

Subsequently, by forming the molten glass into a predetermined shape, a $Li_2O$—$Al_2O_3$—$SiO_2$ based crystallizable glass can be obtained. Here, as a forming method, various forming methods such as a float method, a press method, a roll-out method, and an overflow method can be applied depending on an objective shape.

Thereafter, the formed $Li_2O$—$Al_2O_3$—$SiO_2$ based crystallizable glass was subjected to a heat treatment at from 600 to 800° C. for from 1 to 5 hours to form crystal nuclei (crystal nuclei-forming stage) and further subjected to a heat treatment at from 800 to 950° C. for from 0.5 to 3 hours to precipitate a $Li_2O$—$Al_2O_3$—$SiO_2$ based crystal as a main crystal (crystal-growing stage), thereby obtaining a transparent crystallized glass containing a β-quartz solid solution ($Li_2O \cdot Al_2O_3 \cdot nSiO_2$ [4>n≥2]) as a main crystal. Incidentally, when the $Li_2O$—$Al_2O_3$—$SiO_2$ based crystallizable glass is subjected to a heat treatment at from 600 to 800° C. for from 1 to 5 hours to form crystal nuclei and then further subjected to a heat treatment at from 1,050 to 1,250° C. for from 0.5 to 3 hours, a white crystallized glass containing a β-spodumene solid solution ($Li_2O \cdot Al_2O_3 \cdot nSiO_2$ [n≥4]) as a main crystal can be also obtained.

The thus prepared $Li_2O$—$Al_2O_3$—$SiO_2$ based crystallized glass of the present invention is provided for various applications after being subjected to post processing such as cutting, polishing, or bending processing, or being subjected to decoration on the surface.

EXAMPLES

The present invention is hereunder described with reference to Examples but the present invention should not be construed as being limited to the following Examples.

TABLE 1

| Glass composition | Sample No. | | | | | |
|---|---|---|---|---|---|---|
| (% by mass) | 1 | 2 | 3 | 4 | 5 | 6 |
| $SiO_2$ | 65.5 | 65.4 | 65.6 | 65.5 | 65.2 | 65.5 |
| $Al_2O_3$ | 22.3 | 22.2 | 22.4 | 22.4 | 21.9 | 22.3 |
| $Li_2O$ | 3.7 | 3.7 | 3.7 | 3.7 | 4.2 | 3.7 |
| $Na_2O$ | 0.4 | 0.4 | 0.4 | 0.4 | 0.4 | 0.4 |
| $K_2O$ | 0.3 | 0.3 | 0.3 | 0.3 | 0.3 | 0.3 |
| MgO | 0.7 | 0.7 | 0.7 | 0.7 | 0.9 | 0.7 |
| ZnO | | | | | | |
| BaO | 1.2 | 1.2 | 1.2 | 1.2 | 1.2 | 1.2 |
| $TiO_2$ | 2.0 | 2.0 | 2.0 | 2.0 | 2.0 | 2.0 |
| $ZrO_2$ | 2.2 | 2.2 | 2.2 | 2.2 | 2.2 | 2.2 |
| $P_2O_5$ | 1.4 | 1.4 | 1.4 | 1.4 | 1.4 | 1.4 |

TABLE 1-continued

| Glass composition | Sample No. | | | | | |
|---|---|---|---|---|---|---|
| (% by mass) | 1 | 2 | 3 | 4 | 5 | 6 |
| $SnO_2$ | 0.3 | 0.5 | 0.1 | 0.2 | 0.3 | 0.3 |
| $Fe_2O_3$ (ppm) | 100 | 100 | 100 | 100 | 100 | 100 |
| $V_2O_5$ (ppm) | 2 | 1 | 3 | 0.3 | 3 | 2 |
| $Nd_2O_3$ | — | — | — | — | — | — |
| Li + 0.741Mg + 0.367Zn | 4.2 | 4.2 | 4.2 | 4.2 | 4.9 | 4.2 |
| Melting temperature (° C.) | 1680 | 1680 | 1680 | 1680 | 1680 | 1750 |
| Color tone b* | 3.0 | 2.9 | 3.2 | 2.5 | 2.5 | 3.8 |
| Transmittance (%) | 89.9 | 89.9 | 89.9 | 90.2 | 89.8 | 89.2 |
| Coefficient of thermal expansion ($\times 10^{-7}$/° C.) | −0.9 | −0.9 | −0.9 | −0.9 | −1.1 | −0.9 |

TABLE 2

| Glass composition | Sample No. | | | | |
|---|---|---|---|---|---|
| (% by mass) | 7 | 8 | 9 | 10 | 11 |
| $SiO_2$ | 65.5 | 65.2 | 65.2 | 65.2 | 65.2 |
| $Al_2O_3$ | 22.3 | 21.9 | 22.3 | 21.9 | 21.9 |
| $Li_2O$ | 3.7 | 3.7 | 3.7 | 4.2 | 4.2 |
| $Na_2O$ | 0.4 | 0.4 | 0.4 | 0.4 | 0.4 |
| $K_2O$ | 0.3 | 0.3 | 0.3 | 0.3 | 0.3 |
| MgO | 0.7 | 0.7 | 0.7 | 0.9 | 0.9 |
| ZnO | | | | | |
| BaO | 1.2 | 1.2 | 1.2 | 1.2 | 1.2 |
| $TiO_2$ | 2.0 | 2.0 | 2.0 | 2.0 | 2.0 |
| $ZrO_2$ | 2.2 | 2.2 | 2.2 | 2.2 | 2.2 |
| $P_2O_5$ | 1.4 | 1.4 | 1.4 | 1.4 | 1.4 |
| $SnO_2$ | 0.3 | 1.0 | 0.3 | — | — |
| $Fe_2O_3$ (ppm) | 100 | 100 | 100 | 100 | 100 |
| $V_2O_5$ (ppm) | 20 | 5 | 20 | 20 | 2 |
| $Nd_2O_3$ | — | — | 0.2 | — | — |
| $As_2O_3$ | — | — | — | 0.5 | 0.5 |
| Li + 0.741Mg + 0.367Zn | 4.2 | 4.2 | 4.2 | 4.2 | 4.2 |
| Melting temperature (° C.) | 1680 | 1680 | 1680 | 1680 | 1680 |
| Color tone b* | 8.2 | 4.5 | 4.0 | 3.5 | 2.2 |
| Transmittance (%) | 87.3 | 88.9 | 86.2 | 89.6 | 90.3 |
| Coefficient of thermal expansion ($\times 10^{-7}$/° C.) | −0.9 | −0.9 | −0.9 | −1.0 | −1.0 |

Table 1 shows Examples of the present invention (Sample Nos. 1 to 6) and Table 2 shows Comparative Examples (Sample Nos. 7 to 9). Incidentally, Sample Nos. 10 and 11 are Reference Examples.

First, respective raw materials were compounded each in a form of an oxide, a hydroxide, a carbonate salt, a nitrate salt, or the like and homogeneously blended. Here, with regard to the raw materials of $Al_2O_3$, MgO, $ZrO_2$, and $SiO_2$, $V_2O_5$ amounts of various raw materials were previously confirmed by chemical analysis on ICP-AES and there were used raw materials in which the $V_2O_5$ amount was confirmed to be detection limit or less (detection limit: 0.07 ppm). Furthermore, the adjustment of the $V_2O_5$ amount was conducted by adding a predetermined amount of vanadium pentoxide ($V_2O_5$). In addition, as the formulation equipment and conveying equipment of the raw material batch, there were used equipments in which any $V_2O_5$-containing glass was not handled in the past.

Subsequently, the resulting raw material batch was charged into a refractory furnace fitted with an oxygen combustion burner and was melted at a melting efficiency of 2.5 m²/(t/day) at a maximum temperature in the table. After the glass melt was stirred with a platinum stirrer, the melt was roll-formed in a thickness of 4 mm and further cooled to room temperature within an annealing furnace, thereby obtaining a crystallizable glass.

After the crystallizable glass was subjected to a heat treatment at 760 to 780° C. for 3 hours to perform nucleation, the glass was further subjected to a heat treatment at 870 to 890° C. for 1 hour to achieve crystallization, thereby obtaining a transparent crystallized glass. For the obtained crystallized glass, the $V_2O_5$ amount, color tone, transmittance, and coefficient of thermal expansion were measured.

The $V_2O_5$ amount was confirmed by chemical analysis using ICP-AES.

The color tone of a transmitted light was evaluated by measuring transmittance in a wavelength range of from 380 to 780 nm using a spectrophotometer and calculating an L*a*b* value of CIE Standard from the transmittance.

The transmittance was evaluated by transmittance at a wavelength of 525 nm measured using a spectrophotometer, for a crystallized glass plate, both sides of which were subjected to optical polishing into a thickness of 1.1 mm.

The coefficient of thermal expansion was evaluated by an average linear coefficient of thermal expansion measured in a temperature region of from 30 to 380° C. using a glass sample processed into a solid bar of 20 mm×5 mmϕ.

As is apparent from Table 1, it is revealed that the crystallized glasses of Examples all have a b* value of as small as 4.5 or less and a transmittance of as high as 89% or more.

While the present invention has been described in detail and with reference to specific embodiments thereof, it will be apparent to one skilled in the art that various changes and modifications can be made therein without departing from the spirit and scope of the present invention.

The present application is based on a Japanese patent application filed on May 31, 2012 (Japanese Patent Application No. 2012-124081), the contents of which are incorporated herein by reference.

INDUSTRIAL APPLICABILITY

The $Li_2O$—$Al_2O_3$—$SiO_2$ based crystallized glass of the present invention is suitable for front windows of oil stoves, wood stoves, and the like, substrates for high-technology products such as color filter substrates and image sensor substrates, setters for firing electronic components, trays for microwave ovens, top plates for electromagnetic cooking, window glasses for fire-retarding doors, and the like.

The invention claimed is:
1. A method for producing a $Li_2O$—$Al_2O_3$—$SiO_2$ based crystallized glass, which comprises preparing a raw material batch so as to form a glass comprising from 0.01 to 0.9% of $SnO_2$ in terms of % by mass and having a content of each of $As_2O_3$ and $Sb_2O_3$ of 1,000 ppm or less, melting and forming the batch to produce a $Li_2O$—$Al_2O_3$—$SiO_2$ based crystal- lizable glass, and subsequently subjecting the glass to a heat treatment to achieve crystallization, wherein the b* value of L*a*b* colorimetric system of CIE standard of the crystallized glass standard is from 0 to 4.5 at a thickness of 3 mm and wherein selection of raw materials and management of steps are performed so that a $V_2O_5$ content in the crystallized glass becomes from 0.08 to 15 ppm.

2. The method for producing a $Li_2O$—$Al_2O_3$—$SiO_2$ based crystallized glass according to claim 1, which comprises preparing the batch so as to form a glass comprising from 55 to 75% of $SiO_2$, from 10 to 35% of $Al_2O_3$, from 1 to 10% of $Li_2O$, from 0.2 to 5% of MgO, from 0 to 5% of ZnO, from 0 to 10% of BaO, from 0 to 4% of $TiO_2$, from 0 to 5% of $ZrO_2$, from 0 to 4% of $P_2O_5$, and from 0.01 to 0.9% of $SnO_2$, in terms of % by mass, as a glass composition.

3. The method for producing a $Li_2O$—$Al_2O_3$—$SiO_2$ based crystallized glass according to claim 2, wherein a raw material having a $V_2O_5$ content of 50 ppm or less is used as a raw material of $Al_2O_3$.

4. The method for producing a $Li_2O$—$Al_2O_3$—$SiO_2$ based crystallized glass according to claim 2, wherein a raw material having a $V_2O_5$ content of 400 ppm or less is used as a raw material of MgO.

5. The method for producing a $Li_2O$—$Al_2O_3$—$SiO_2$ based crystallized glass according to claim 2, wherein the batch is prepared so as to form a glass comprising from 17 to 27% of $Al_2O_3$ and from 0.2 to 4% of MgO, in terms of % by mass, as a glass composition.

6. The method for producing a $Li_2O$—$Al_2O_3$—$SiO_2$ based crystallized glass according to claim 1, wherein melting is performed at a temperature of less than 1,750° C.

7. The method for producing a $Li_2O$—$Al_2O_3$—$SiO_2$ based crystallized glass according to claim 1, wherein a β-quartz solid solution is precipitated as a main crystal by a heat treatment.

* * * * *